(12) United States Patent
Wang et al.

(10) Patent No.: US 12,211,413 B2
(45) Date of Patent: Jan. 28, 2025

(54) GATE DRIVE CIRCUIT HAVING A SHIFT REGISTER UNIT AND CONTROL UNIT AND DRIVING METHOD THEREOF

(71) Applicant: BOE Technology Group Co., Ltd., Beijing (CN)

(72) Inventors: Hongrun Wang, Beijing (CN); Fuqiang Li, Beijing (CN); Jing Yu, Beijing (CN); Xue Dong, Beijing (CN); Changfeng Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/273,039

(22) PCT Filed: Aug. 23, 2022

(86) PCT No.: PCT/CN2022/114093
§ 371 (c)(1),
(2) Date: Jul. 19, 2023

(87) PCT Pub. No.: WO2023/045668
PCT Pub. Date: Mar. 30, 2023

(65) Prior Publication Data
US 2024/0127731 A1    Apr. 18, 2024

(30) Foreign Application Priority Data

Sep. 24, 2021  (CN) .......................... 202111124265.9

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2310/0267* (2013.01); *G09G 2310/0286* (2013.01)

(58) Field of Classification Search
CPC ........................................................ G09G 3/20
(Continued)

(56) References Cited

U.S. PATENT DOCUMENTS

2008/0316189 A1* 12/2008 Choi .................. G09G 3/20
                                                            345/204
2009/0128476 A1*  5/2009 Lee ..................... G09G 3/3677
                                                            345/98

(Continued)

FOREIGN PATENT DOCUMENTS

CN      104766587 A    7/2015
CN      108231029 A    6/2018

(Continued)

OTHER PUBLICATIONS

PCT/CN2022/114093 international search report.

(Continued)

*Primary Examiner* — Long D Pham
(74) *Attorney, Agent, or Firm* — IPro, PLLC

(57) ABSTRACT

A display panel, a gate drive circuit, a shift register unit and a driving method thereof. The shift register unit includes: a shift register (1) connected with a signal input end (CR) and a signal output end (OUT), configured to control an electric potential of the signal output end (OUT) under control of an electric potential of the signal input end (CR); a control circuit (2) connected with a start signal end (STV), a control signal end (EN) and the signal input end (CR), configured to control the start signal end (STV) to connect to the signal input end (CR) under control of an electric potential of the control signal end (EN). The present disclosure can achieve independent refreshing of any area on the display panel.

14 Claims, 6 Drawing Sheets

(58) Field of Classification Search
USPC .......................................................... 345/212
See application file for complete search history.

(56) References Cited

U.S. PATENT DOCUMENTS

| | | | |
|---|---|---|---|
| 2016/0240159 A1* | 8/2016 | Ohkawa | G09G 3/3677 |
| 2017/0124955 A1 | 5/2017 | Wang et al. | |
| 2018/0075808 A1 | 3/2018 | Yamashita et al. | |
| 2023/0098375 A1 | 3/2023 | Zhao et al. | |

FOREIGN PATENT DOCUMENTS

| | | |
|---|---|---|
| CN | 109767740 A | 5/2019 |
| CN | 109830256 A | 5/2019 |
| CN | 110136626 A | 8/2019 |
| CN | 110582805 A | 12/2019 |
| CN | 111798806 A | 10/2020 |
| CN | 111933084 A | 11/2020 |
| CN | 113763885 A | 12/2021 |
| JP | 2009223051 A | 10/2009 |
| JP | 2011133680 A | 7/2011 |
| WO | 2020215906 A1 | 10/2020 |
| WO | 2020233265 A1 | 11/2020 |

OTHER PUBLICATIONS

PCT/CN2022/114093 Written Opinion.
CN2021111242659 first office action.
CN2021111242659 second office action.
CN2021111242659 third office action.
CN2021111242659 Decision of Rejection.
Franco Maloberti. "Data Converters." translated by Cheng Jun et al, Xi"An Jiaotong University Press, Jul. 30, 2013. Chapter 5, p. 209-213.

* cited by examiner

GATE DRIVE CIRCUIT HAVING A SHIFT REGISTER UNIT AND CONTROL UNIT AND DRIVING METHOD THEREOF

CROSS-REFERENCE TO RELATED APPLICATIONS

This application is a national stage of international PCT Application No. PCT/CN2022/114093 filed on Aug. 23, 2022, the entire contents of which are incorporated herein by reference.

TECHNICAL FIELD

The present disclosure relates to the field of display technology, and in particular, to a display panel, a gate drive circuit, a shift register unit and a driving method thereof.

BACKGROUND

A gate drive circuit is an important auxiliary circuit in active matrix organic light-emitting diode (AMOLED) display. Existing gate drive circuits include cascaded shift register units. However, performance of a display panel with the gate drive circuit needs to be further improved.

SUMMARY

A purpose of the present disclosure is to provide a display panel, a gate drive circuit, a shift register unit and a driving method thereof, to achieve independent refreshing of any area on the display panel.

According to an aspect of the present disclosure, a shift register unit is provided, including:
- a shift register connected with a signal input end and a signal output end, configured to control an electric potential of the signal output end under control of an electric potential of the signal input end;
- a control circuit connected with a start signal end, a control signal end and the signal input end, configured to control the start signal end to connect to the signal input end according to an electric potential of the control signal end.

Further, the control circuit includes:
- a start signal write sub-circuit connected with the start signal end, a first node and the signal input end, configured to control the start signal end to connect to the signal input end under control of an electric potential of the first node;
- a first control sub-circuit connected to the control signal end and the first node, configured to control the electric potential of the first node according to the electric potential of the control signal end.

Further, the first control sub-circuit is connected to the signal output end, and is configured to control the first node to connect to the control signal end under control of the electric potential of the signal output end.

Further, the start signal write sub-circuit includes:
- a first transistor, where a first electrode of the first transistor is connected to the start signal end, a second electrode of the first transistor is connected to the signal input end, and a control electrode of the first transistor is connected to the first node.

Further, the first control sub-circuit includes:
- a second transistor, where a first electrode of the second transistor is connected to the control signal end, a second electrode of the second transistor is connected to the first node, and a control electrode of the second transistor is connected to the signal output end.

Further, the control circuit further includes:
- a storage sub-circuit connected to the first node, configured to maintain the electric potential of the first node.

Further, the storage sub-circuit includes:
- a storage capacitor, where a first electrode of the storage capacitor is connected to the first node, and a second electrode of the storage capacitor is connected to a fixed power end.

Further, the control circuit includes:
- a logic gate circuit, where a first input end of the logic gate circuit is connected to the start signal end, a second input end of the logic gate circuit is connected to a second node, and an output end of the logic gate circuit is connected to the signal input end;
- a second control sub-circuit connected to the control signal end and the second node, configured to control an electric potential of the second node according to the electric potential of the control signal end.

Further, a valid electric level of the start signal end is at high level, and a logic gate is an AND gate; or
a valid electric level of the start signal end is at low level, and a logic gate is an OR gate.

Further, the second control sub-circuit is connected to the signal output end, and is configured to control the electric potential of the second node according to the electric potential of the control signal end and the electric potential of the signal output end.

Further, the second control sub-circuit includes:
- a latch, where a first input end of the latch is connected to the control signal end, a second input end of the latch is connected to the signal output end, and an output end of the latch is connected to the second input end of the logic gate circuit.

According to an aspect of the present disclosure, a gate drive circuit is provided, including cascaded shift register units.

According to an aspect of the present disclosure, a display panel is provided, including the gate drive circuit.

According to an aspect of the present disclosure, a driving method of the shift register unit is provided, where the driving method adopts the shift register unit, and the driving method includes:
- driving the shift register to control the electric potential the signal output end under control of the electric potential of the signal input end;
- driving the control circuit to control the start signal end to connect to the signal input end according to the electric potential of the control signal end.

According to a display panel, a gate drive circuit, a shift register unit and a driving method thereof of the present disclosure, a control circuit is connected with a start signal end, a control signal end and a signal input end. When shift register units are applied to the gate drive circuit, the control circuit can control the start signal end to connect to the signal input end according to an electric potential of the control signal end, so as to control whether to input a start signal to a shift register, so as to start to drive the display panel from any one of the shift register units, so that the display panel can refresh from any pixel row, thereby achieving independent refreshing of any area on the display panel.

Figure 1:
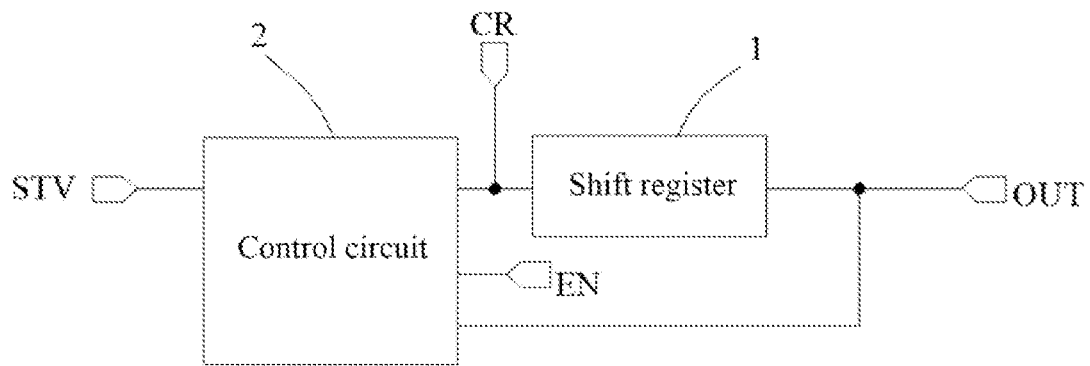
FIG. 1 is a block diagram of a shift register unit of an embodiment of the present disclosure.

Reference numerals: 1, shift register; 101, input sub-circuit; 102, output sub-circuit; 103, reset sub-circuit; 2, control circuit; 201, start signal write sub-circuit; 202, first control sub-circuit; 203, storage sub-circuit; 204, logic gate circuit; 205, second control sub-circuit.

DETAILED DESCRIPTION

Description will now be made in detail to illustrative embodiments, examples of which are shown in the accompanying drawings. When the following description refers to the drawings, unless otherwise indicated, the same numbers in different drawings indicate the same or similar elements. Embodiments described in the following illustrative embodiments do not represent all embodiments consistent with the present disclosure. In contrary, they are merely examples of apparatuses consistent with some aspects of the present disclosure as described in detail in the appended claims.

The terminologies used in the present disclosure are for the purpose of describing specific embodiments only and are not intended to limit the present disclosure. Unless otherwise defined, technical terms or scientific terms used in the present disclosure shall have their ordinary meanings as understood by those of ordinary skills in the field to which the present disclosure belongs. The "first", "second" and similar words used in the specification and claims of the present disclosure do not indicate any order, quantity or importance, but are only used to distinguish different components. Similarly, similar words such as "a" or "an" do not mean quantity limitation, but mean that there is at least one. "Multiple" or "a plurality of" means two or more. Similar words such as "include" or "comprise" mean that the elements or objects appear before "include" or "comprise" cover the elements or objects listed after "include" or "comprise" and their equivalents, but do not exclude other elements or objects. Similar words such as "connect" or "couple" are not limited to physical or mechanical connection, but may include electrical connection, whether direct or indirect. Singular forms "a", "the" and "said" used in the specification of the present disclosure and the appended claims are also intended to include plural forms, unless the context clearly indicates other meaning. It should also be understood that the term "and/or" as used herein refers to and includes any or all possible combinations of one or more associated listed items.

In related arts, amount of data displayed by a light field is large. In order to save display resources, a gate drive circuit arranged in a peripheral area of a display panel is generally divided into a plurality of drive areas, and each of the drive areas includes cascaded shift register units. Each of the drive areas is provided with a corresponding start signal line, resulting in a large number of start signal lines. In addition, after the drive areas are divided, a shift register unit in one drive area and a shift register unit in another drive area cannot form a new drive area, that is, once the drive areas are divided, no adjustment can be made, thus arbitrary division of the gate drive circuit cannot be achieved. For a display panel, as arbitrary division of the gate drive circuit cannot be achieved, independent refreshing of any area on the display panel cannot be achieved.

A transistor adopted in the present disclosure may be a triode, a thin film transistor or a field effect transistor, or other devices with the same characteristics. In an embodiment of the present disclosure, in order to distinguish two electrodes of a transistor other than a control electrode, one of the two electrodes is referred to as a first electrode and the other one is referred to as a second electrode.

In actual operation, when the transistor is a triode, the control electrode may be a base electrode, the first electrode may be a collector electrode, and the second electrode may be an emitter electrode; alternatively, the control electrode may be a base electrode, the first electrode may be an emitter electrode, and the second electrode may be a collector electrode.

In actual operation, when the transistor is a thin film transistor or a field effect transistor, the control electrode may be a gate electrode, the first electrode may be a drain electrode, and the second electrode may be a source electrode; alternatively, the control electrode may be a gate electrode, the first electrode may be a source electrode, and the second electrode may be a drain electrode.

An embodiment of the present disclosure provides a shift register unit applied to a gate drive circuit. As shown in FIG. 1, the shift register unit may include a shift register 1 and a control circuit 2.

The shift register 1 is connected with a signal input end CR and a signal output end OUT, and is configured to control an electric potential of the signal output end OUT under control of an electric potential of the signal input end CR. The control circuit 2 is connected with a start signal end STV, a control signal end EN and the signal input end CR, and is configured to control the start signal end STV to connect to the signal input end CR according to an electric potential of the control signal end EN.

According to the shift register unit of an embodiment of the present disclosure, the control circuit 2 is connected with the start signal end STV, the control signal end EN and the signal input end CR. When shift register units are applied to the gate drive circuit, the control circuit 2 can control the start signal end STV to connect to the signal input end CR according to an electric potential of the control signal end EN, so as to control whether to input a start signal to a shift register 1, so as to start to drive the display panel from any one of the shift register units, so that the display panel can refresh from any pixel row, thereby achieving independent refreshing of any area on the display panel.

Respective part of the shift register unit of an embodiment of the present disclosure will be described in detail below.

Figure 2:
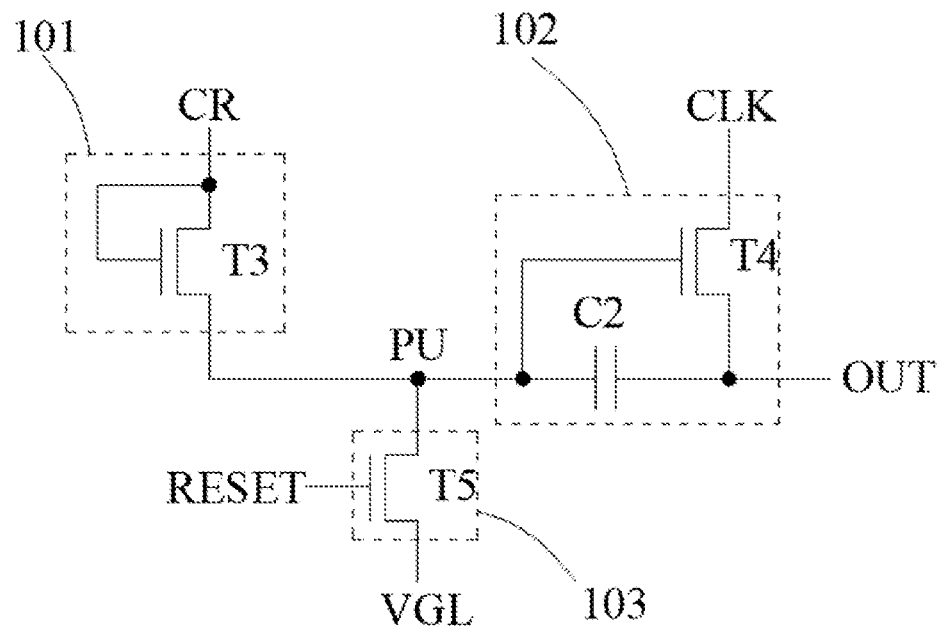
FIG. 2 is a circuit diagram of a shift register in a shift register unit of an embodiment of the present disclosure.

As shown in FIG. 2, the shift register 1 is connected with a signal input end CR and a signal output end OUT, and is configured to control an electric potential of the signal output end OUT under control of an electric potential of the signal input end CR. The shift register 1 may include an input sub-circuit 101 and an output sub-circuit 102. The output sub-circuit 102 may be connected with the signal input end CR and a pull-up node PU, and may be configured to control an electric potential of the pull-up node PU according to the electric potential of the signal input end CR. The output sub-circuit 102 may be connected with the signal output end OUT, a clock signal end CLK and a pull-up node PU, and the output sub-circuit 102 is configured to control the clock signal end CLK to connect to the signal output end OUT under control of an electric potential of the pull-up node PU. The shift register 1 may further include a reset sub-circuit 103. The reset sub-circuit 103 may be connected with the pull-up node PU and the reset signal end RESET, and the reset sub-circuit 103 is configured to reset the pull-up node PU under control of an electric potential of the reset signal end RESET.

For example, as shown in FIG. 2, the input sub-circuit 101 may include a third transistor T3, the output sub-circuit 102 may include a fourth transistor T4, and the reset sub-circuit 103 may include a fifth transistor T5. A first electrode of the third transistor T3 is connected to the signal input end CR, a second electrode of the third transistor T3 is connected to the pull-up node PU, and a control electrode of the third transistor T3 may be connected to the signal input end CR. A first electrode of the fourth transistor T4 is connected to the clock signal end CLK, a second electrode of the fourth transistor T4 is connected to the signal output end OUT, and a control electrode of the fourth transistor T4 may be connected to the pull-up node PU. A first electrode of the fifth transistor T5 is connected to a reset power end VGL, a second electrode of the fifth transistor is connected to the pull-up node PU, and a control electrode of the fifth transistor T5 is connected to the reset signal end RESET. In addition, the output sub-circuit 102 may further include a bootstrap capacitor C2. A first electrode of the bootstrap capacitor C2 is connected to the pull-up node PU, a second electrode of the bootstrap capacitor C2 is connected to the signal output end OUT.

As shown in FIG. 1, the control circuit 2 is connected with the start signal end STV, the control signal end EN and the signal input end CR, and is configured to control the start signal end STV to connect to the signal input end CR according to the electric potential of the control signal end EN, so as to write the electric potential of the start signal end STV into the signal input end CR.

Figure 3:
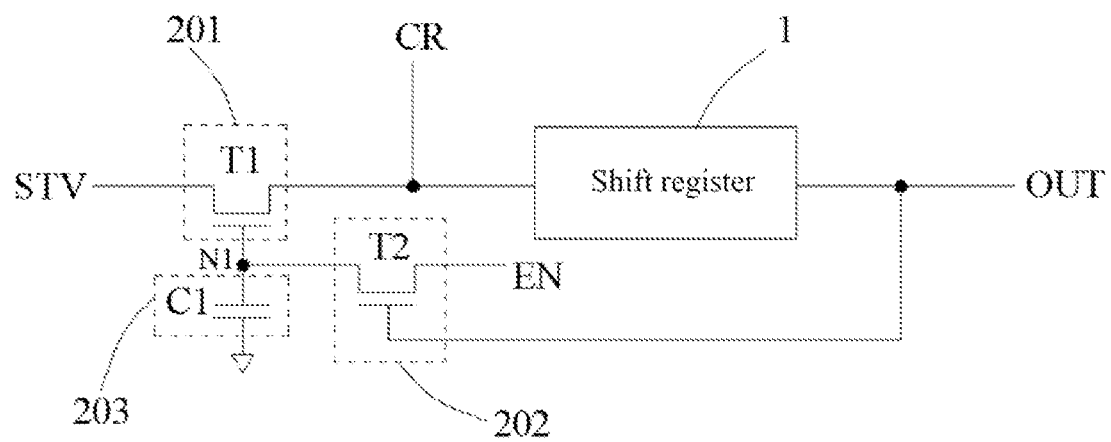
FIG. 3 is a circuit diagram of a shift register unit of an embodiment of the present disclosure.

In an embodiment of the present disclosure, as shown in FIG. 3, the control circuit 2 may include a start signal write sub-circuit 201 and a first control sub-circuit 202. The start signal write sub-circuit 201 is connected with the start signal end STV, a first node N1 and the signal input end CR, and is configured to control the start signal end STV to connect to the signal input end CR under control of an electric potential of the first node N1. The first control sub-circuit 202 is connected to the control signal end EN and the first node N1, and is configured to control the electric potential of the first node N1 according to the electric potential of the control signal end EN. Further, the first control sub-circuit 202 is connected to the signal output end OUT, and is configured to control the first node N1 to connect to the control signal end EN under control of the electric potential of the signal output end OUT. For example, the start signal write sub-circuit 201 may include a first transistor T1. A first electrode of the first transistor T1 is connected to the start signal end STV, a second electrode of the first transistor T1 is connected to the signal input end CR, and a control electrode of the first transistor T1 is connected to the first node N1. The first control sub-circuit 202 includes a second transistor T2. A first electrode of the second transistor T2 is connected to the control signal end EN, a second electrode of the second transistor T2 is connected to the first node N1, and a control electrode of the second transistor T2 is connected to the signal output end OUT. In addition, the control circuit 2 may further include a storage sub-circuit 203. The storage sub-circuit 202 may be connected to the first node N1, and is configured to maintain the electric potential of the first node N1. For example, the storage sub-circuit 203 may include a storage capacitor C1. A first electrode of the storage capacitor C1 is connected to the first node N1, a second electrode of the storage capacitor C1 is connected to a fixed power end. The fixed power end may be grounded, which is not limited by embodiments of the present disclosure.

Figure 4:
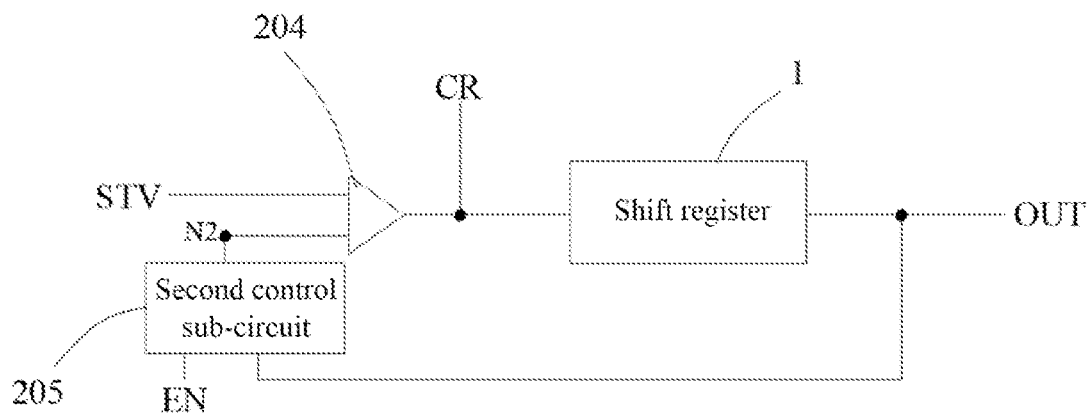
FIG. 4 is another circuit diagram of a shift register unit of an embodiment of the present disclosure.

In another embodiment of the present disclosure, as shown in FIG. 4, the control circuit 2 may include a logic gate circuit 204 and a second control sub-circuit 205. A first input end of the logic gate circuit 204 is connected to the start signal end STV, a second input end of the logic gate circuit 204 is connected to a second node N2, and an output end of the logic gate circuit 204 is connected to the signal input end CR. By taking that a valid electric potential of the start signal end STV is a high electric potential as an example, the logic gate may be an AND gate. That is, the logic gate outputs a high electric potential only when both the electric potential of the start signal end STV and the electric potential of the second node N2 are high electric potentials. By taking that a valid electric potential of the start signal end STV is a low electric potential as an example, the logic gate may be an OR gate. That is, the logic gate outputs a low electric potential only when both the electric potential of the start signal end STV and the electric potential of the second node N2 are low electric potentials.

As shown in FIG. 4, the second control sub-circuit 205 is connected to the control signal end EN and the second node N2, and is configured to control the electric potential of the second node N2 according to the electric potential of the control signal end EN. Further, the second control sub-circuit 205 is connected to the signal output end OUT, and is configured to control the electric potential of the second node N2 according to the electric potential of the control signal end EN and the electric potential of the signal output end OUT. For example, the second control sub-circuit 205 may include a latch. A first input end of the latch is connected to the control signal end EN, a second input end of the latch is connected to the signal output end OUT, and an output end of the latch is connected to the second input end of the logic gate circuit 204.

An embodiment of the present disclosure further includes a driving method of a shift register unit. The driving method may adopt the shift register unit according to any one of the above embodiments. The driving method may include: driving the shift register 1 to control the electric potential of the signal output end OUT under control of the electric potential of the signal input end CR; driving the control circuit 2 to control the start signal end STV to connect to the signal input end CR according to the electric potential of the control signal end EN.

Figure 5:
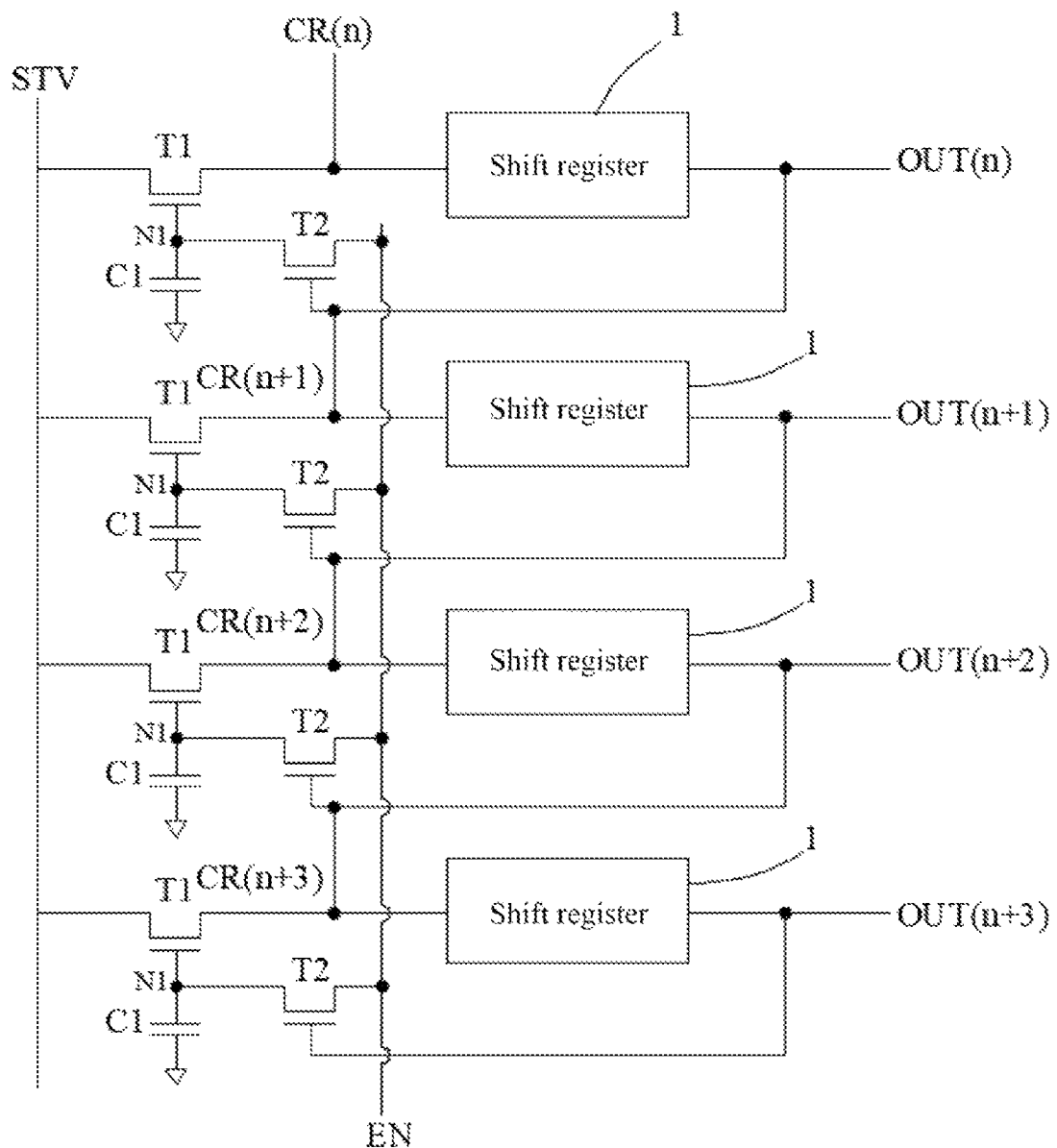
FIG. 5 is a schematic diagram of a gate drive circuit of an embodiment of the present disclosure.
Figure 6:
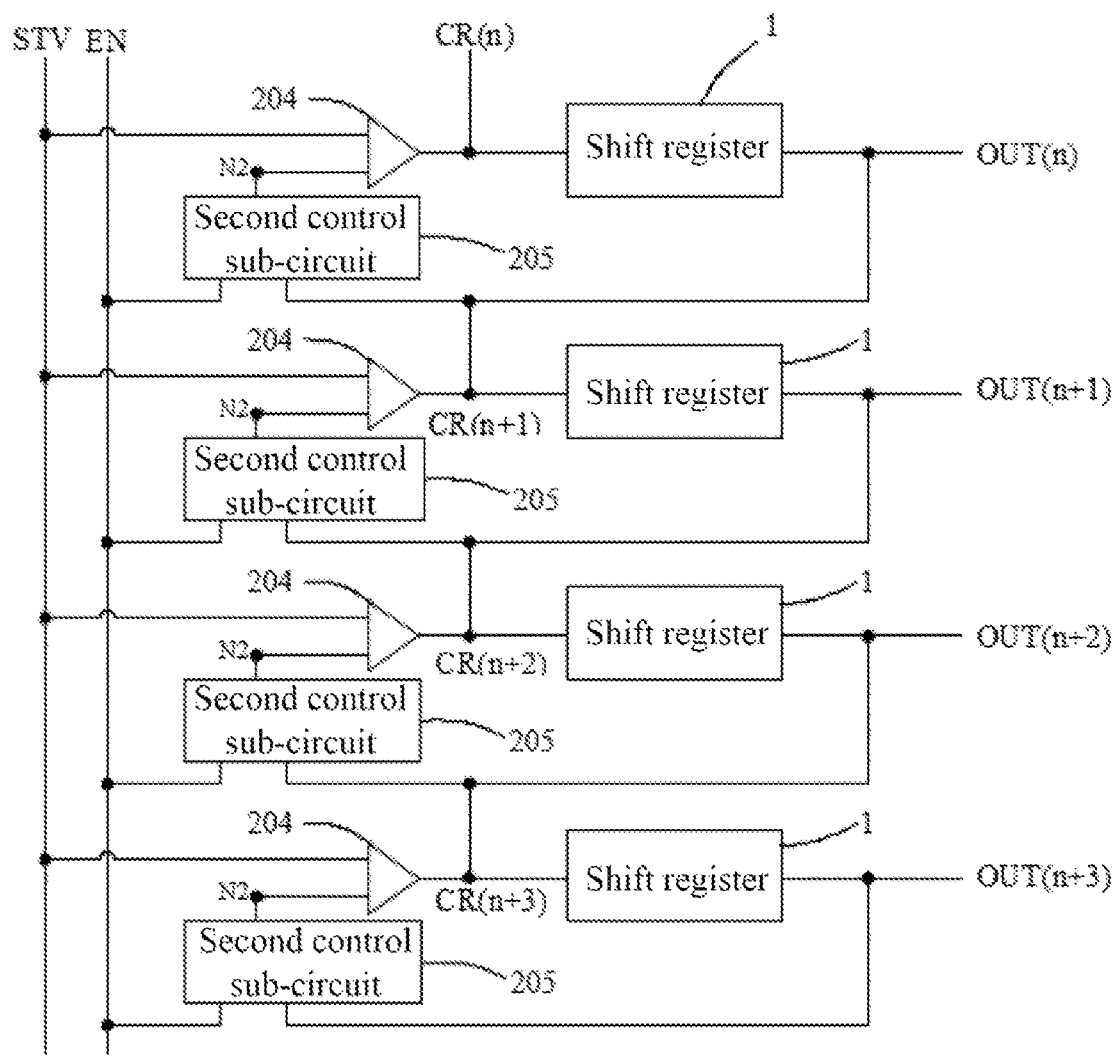
FIG. 6 is another schematic diagram of a gate drive circuit of an embodiment of the present disclosure.

An embodiment of the present disclosure further provides a gate drive circuit. As shown in FIGS. 5 and 6, the gate drive circuit may include cascaded shift register units according to any one of the above embodiments. The control circuits 2 in respective shift register units may be connected to a same start signal end STV, that is, the control circuits 2 in the respective shift register units may be connected to a same start signal line. For a display panel including pixel rows, the shift register units in the gate drive circuit are connected to different pixel rows respectively. In the gate drive circuit of the present disclosure, a signal input end CR(n) of a shift register unit may be connected with a signal output end OUT(n−1) of a previous shift register unit, which is not limited by the embodiments of the present disclosure.

Figure 7:
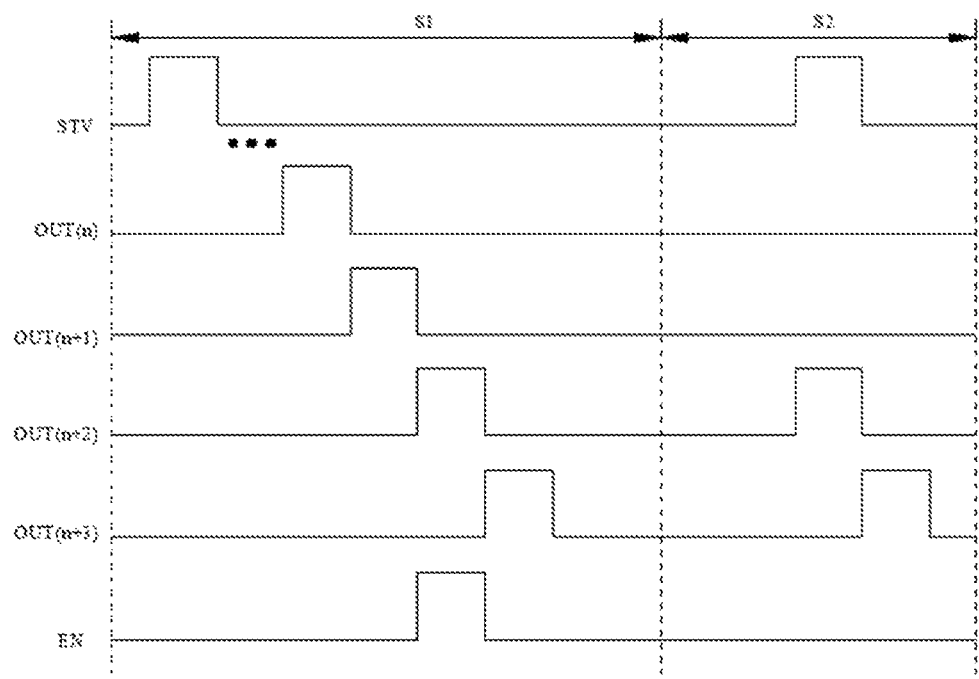
FIG. 7 is an operating sequence diagram of a gate drive circuit of an embodiment of the present disclosure.

FIG. 7 shows an operating sequence diagram of a gate drive circuit of an embodiment of the present disclosure. Operating process of the gate drive circuit in FIG. 5 will be described in detail with reference to the operating sequence diagram shown in FIG. 7. For example, all the transistors mentioned above are N-type thin film transistors, and an on-level of all transistors are high level.

As shown in FIGS. 5 and 7, in a first stage S1, a high-level start signal is output to a signal input end of a first shift register unit through a start signal end STV, so as to scan a display panel including pixel rows in full screen. When a signal output end OUT(n+2) and a control signal end EN are both at high-level, a second transistor T2 of a (n+2)-th shift register unit is turned on, and a first node N1 is at high-level and is maintained by a storage capacitor C1, the second transistor T2 of the (n+2)-th shift register is in an ON state and is maintained. In a second stage S2, when the start signal end STV is at high level, since the second transistor T2 of the (n+2)-th shift register unit is in the ON state, a signal input end CR(n+2) of the (n+2)-th shift register unit is written at high level, so that the signal output end OUT(n+2) of the (n+2)-th shift register unit is at high level. As acknowledged, for the gate drive circuit of the present disclosure, the driving can be started from the (n+2)-th shift register unit, and by changing a sequence of the control signal end EN, the driving can be started from any shift register unit, that is, the scanning can be started from any row of the display panel.

The operating process of the gate drive circuit in FIG. 6 will be described in detail with reference to the operating sequence diagram shown in FIG. 7. The logic gate circuit 204 is an AND gate, and the second control sub-circuit 205 includes a latch.

As shown in FIGS. 6 and 7, in a first stage S1, a high-level start signal is output to a signal input end of a first shift register unit through a start signal end STV, so as to scan a display panel including pixel rows in full screen. When a signal output end OUT(n+2) and a control signal end EN are both at high-level, a signal output by the latch is at high level. When the level of the control signal end EN is changed from a high level to a low level, the signal output by the latch is maintained at high level. In a second stage S2, when the start signal end STV is at high level, since the signal output by the latch of the (n+2)-th shift register unit is at high level, the logic gate circuit 204 of the (n+2)-th shift register unit outputs a high level, so that signal input end CR(n+2) is at high level, and the signal output end OUT(n+2) of the (n+2)-th shift register unit is at high level. As acknowledged, for the gate drive circuit of the present disclosure, the driving can be started from the (n+2)-th shift register unit, and by changing a sequence of the control signal end EN, the driving can be started from any shift register unit, that is, the scanning can be started from any row of the display panel.

Figure 8:
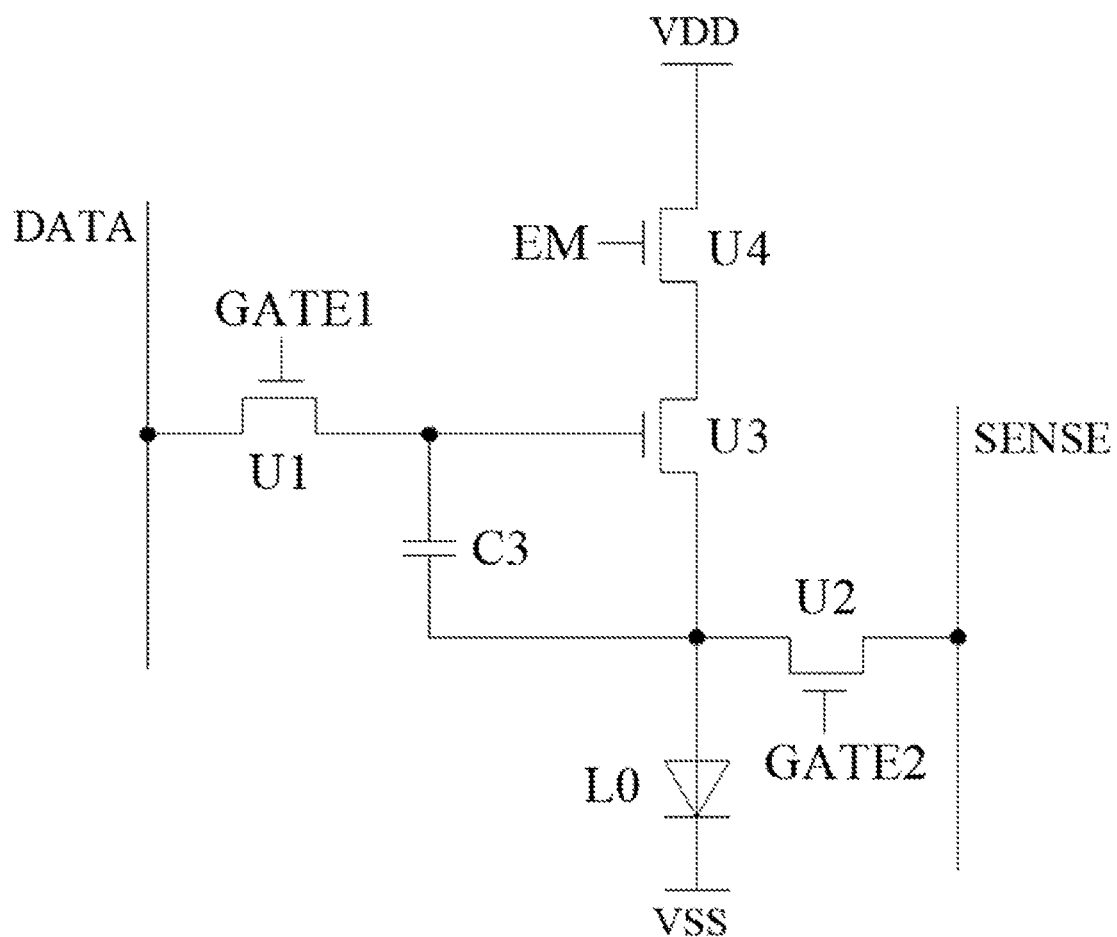
FIG. 8 is a schematic diagram of a pixel drive circuit of an embodiment of the present disclosure.

An embodiment of the present disclosure further provides a display panel. The display panel may include the gate drive circuit according to any one of the above embodiments. Certainly, the display panel may further include a pixel drive circuit. As shown in FIG. 8, the pixel drive circuit may include a scanning transistor U1, a driving transistor U3 and a light-emitting control transistor U4. A control electrode of the scanning transistor U1 is connected to a scanning line, a first electrode of the scanning transistor U1 is connected to a data signal line DATA, and a second electrode of the scanning transistor U1 is connected to a control electrode of the driving transistor U3. The light-emitting control transistor U4 is used to receive a light-emitting control signal EM, a first electrode of the light-emitting control transistor U4 is connected with a power end VDD, a second electrode of the light-emitting control transistor U4 is connected with a first electrode of the driving transistor U3, and a second electrode of the driving transistor U3 is connected with a first electrode of a light-emitting component L0, and a second electrode of the light-emitting component L0 is connected with a power end VSS. The signal output by the gate signal output end OUT<n> may be the light-emitting control signal EM. The pixel drive circuit may further include a first capacitor C3 and a sensing transistor U2. The first capacitor C3 is connected between the first electrode of the light-emitting component L0 and a control electrode of the driving transistor U3. A first electrode of the sensing transistor U2 is connected with a sensing line SENSE, a second electrode of the sensing transistor U2 is connected to the first electrode of the light-emitting component L0.

The display panel, the gate drive circuit, the shift register unit and the driving method thereof belong to a same inventive concept, and descriptions of related details and advantageous effects can be referred to each other, which will not be repeated.

The above are only preferred embodiments of the present disclosure, and they do not limit the present disclosure in any form. Although the present disclosure has been disclosed in the preferred embodiments, they are not used to limit the present disclosure. Any person familiar with this profession can make some changes or modify it into an equivalent embodiment by using the technical content disclosed above without departing from the scope of the technical solution of the present disclosure. So long as the content does not depart from the technical solution of the present disclosure, any simple modifications, equivalent changes or modifications made to the above embodiments according to the technical essence of the present disclosure belong to the scope of the technical solution of the present disclosure.

The invention claimed is:

1. A shift register unit, comprising:
    a shift register connected with a signal input end and a signal output end, configured to control an electric potential of the signal output end under control of an electric potential of the signal input end;
    a control circuit connected with a start signal end, a control signal end and the signal input end, configured to control the start signal end to connect to the signal input end according to an electric potential of the control signal end;
    wherein the control circuit comprises:
    a start signal write sub-circuit connected with the start signal end, a first node and the signal input end, configured to control the start signal end to connect to the signal input end under control of an electric potential of the first node; and
    a first control sub-circuit connected to the control signal end and the first node, configured to control the electric potential of the first node according to the electric potential of the control signal end.

2. The shift register unit according to claim 1, wherein the first control sub-circuit is connected to the signal output end, and is configured to control the first node to connect to the control signal end under control of the electric potential of the signal output end.

3. The shift register unit according to claim 2, wherein the start signal write sub-circuit comprises:
    a first transistor, wherein a first electrode of the first transistor is connected to the start signal end, a second electrode of the first transistor is connected to the signal input end, and a control electrode of the first transistor is connected to the first node.

4. The shift register unit according to claim 2, wherein the first control sub-circuit comprises:
a second transistor, wherein a first electrode of the second transistor is connected to the control signal end, a second electrode of the second transistor is connected to the first node, and a control electrode of the second transistor is connected to the signal output end.

5. The shift register unit according to claim 1, wherein the control circuit further comprises:
a storage sub-circuit connected to the first node, configured to maintain the electric potential of the first node.

6. The shift register unit according to claim 5, wherein the storage sub-circuit comprises:
a storage capacitor, wherein a first electrode of the storage capacitor is connected to the first node, and a second electrode of the storage capacitor is connected to a fixed power end.

7. A gate drive circuit, comprising cascaded shift register units according to claim 1.

8. A display panel, comprising the gate drive circuit according to claim 7.

9. A driving method of a shift register unit, wherein the driving method adopts the shift register unit according to claim 1, and the driving method comprises:
driving the shift register to control the electric potential the signal output end under control of the electric potential of the signal input end;
driving the control circuit to control the start signal end to connect to the signal input end according to the electric potential of the control signal end.

10. A shift register unit, comprising:
a shift register connected with a signal input end and a signal output end, configured to control an electric potential of the signal output end under control of an electric potential of the signal input end;
a control circuit connected with a start signal end, a control signal end and the signal input end, configured to control the start signal end to connect to the signal input end according to an electric potential of the control signal end;
wherein the control circuit comprises:
a logic gate circuit, wherein a first input end of the logic gate circuit is connected to the start signal end, a second input end of the logic gate circuit is connected to a second node, and an output end of the logic gate circuit is connected to the signal input end;
a second control sub-circuit connected to the control signal end and the second node, configured to control an electric potential of the second node according to the electric potential of the control signal end.

11. The shift register unit according to claim 10, wherein a valid electric level of the start signal end is at high level, and a logic gate is an AND gate; or
a valid electric level of the start signal end is at low level, and a logic gate is an OR gate.

12. The shift register unit according to claim 10, wherein the second control sub-circuit is connected to the signal output end, and is configured to control the electric potential of the second node according to the electric potential of the control signal end and the electric potential of the signal output end.

13. The shift register unit according to claim 12, wherein the second control sub-circuit comprises:
a latch, wherein a first input end of the latch is connected to the control signal end, a second input end of the latch is connected to the signal output end, and an output end of the latch is connected to the second input end of the logic gate circuit.

14. A driving method of a shift register unit, wherein the driving method adopts the shift register unit according to claim 10, and the driving method comprises:
driving the shift register to control the electric potential the signal output end under control of the electric potential of the signal input end;
driving the control circuit to control the start signal end to connect to the signal input end according to the electric potential of the control signal end.

* * * * *